United States Patent [19]

Klassen et al.

[11] Patent Number: 5,066,919
[45] Date of Patent: Nov. 19, 1991

[54] FAULT DETECTION AND ISOLATION IN AUTOMOTIVE WIRING HARNESS BY NETWORK ANALYSIS METHOD

[75] Inventors: David J. Klassen, Dearborn; Edward G. Anderson, Bloomfield Hills, both of Mich.

[73] Assignee: Ford Motor Company, Dearborn, Mich.

[21] Appl. No.: 504,458

[22] Filed: Apr. 3, 1990

[51] Int. Cl.⁵ .......................................... G01R 31/00
[52] U.S. Cl. ................................... 324/538; 324/503
[58] Field of Search .............. 324/66, 539, 540, 541, 324/538, 503

[56] References Cited

U.S. PATENT DOCUMENTS

| | | | |
|---|---|---|---|
| 3,609,535 | 9/1971 | Paine et al. | 324/513 |
| 3,699,438 | 10/1972 | Webb | 324/66 |
| 3,718,859 | 2/1973 | Arlow | 324/72.5 |
| 3,728,616 | 4/1973 | Cheek et al. | 324/66 X |
| 4,042,832 | 8/1977 | Cassarino, Jr. et al. | 324/538 |
| 4,218,745 | 8/1980 | Perkins | 324/66 |
| 4,257,002 | 3/1981 | Helms et al. | 324/66 |
| 4,271,388 | 6/1981 | Schaling | 324/66 X |
| 4,322,677 | 3/1982 | Wright | 324/531 |
| 4,399,400 | 8/1983 | Rockwell et al. | 324/66 X |
| 4,689,551 | 8/1987 | Ryan et al. | 324/66 X |
| 4,812,752 | 3/1989 | Preuss | 324/542 |
| 4,843,327 | 6/1989 | Koppitsch et al. | 324/525 |
| 4,859,953 | 8/1989 | Young et al. | 324/539 |

FOREIGN PATENT DOCUMENTS 0164570 7/1985 European Pat. Off. .

Primary Examiner—Kenneth A. Wieder
Assistant Examiner—Robert W. Mueller
Attorney, Agent, or Firm—Mark Mollon; Roger L. May

[57] ABSTRACT

An automotive electrical system including a wiring harness incorporates a dedicated test line passing through critical connectors and components for allowing detection and isolation of improperly connected connectors. The dedicated test line can feed through expansion connectors, termination connectors, and junction blocks. A respective impedance is connected between the dedicated test line and ground at each respective connector. Connector fault detection and isolation is achieved by measuring the total impedance presented at the beginning of the test line. The measured impedance uniquely identifies the locations of any improperly connected connectors.

9 Claims, 4 Drawing Sheets

FAULT DETECTION AND ISOLATION IN AUTOMOTIVE WIRING HARNESS BY NETWORK ANALYSIS METHOD

CROSS-REFERENCE TO RELATED APPLICATIONS

This application is related to copending and commonly assigned U.S. application Ser. No. (89-349) and U.S. application Ser. No. (89-353), both filed on the same date as this application.

BACKGROUND OF THE INVENTION

The present invention relates in general to the detection and isolation of interconnect faults in an automotive wiring system, and more specifically to the application of a test signal to a dedicated test line included in the wiring harness and the monitoring of an electrical characteristic of the test line to determine the existence and/or location of improperly connected connectors.

The electrical interconnect system of an automobile takes the form of a wiring harness which is normally partitioned into segments. Each segment includes a number of individual conductors. Individual segments are joined by electrical connectors at either end. Furthermore, an individual conductor or conductors may leave the main bundle of wires in a particular segment to form a subsegment which extends to another connector. The shape of the wiring system is irregular and cannot normally be classified as a star, ring or other regular configuration.

Because of the segmented structure of a wiring harness, point-to-point connections between the electrical system load devices interconnected in the wiring system normally include many connectors and conductor segments. These connectors include expansion connectors, termination connectors, and junction blocks. An expansion connector interconnects the partitioned segments of the wiring harness, i.e., expands the wiring harness. Termination connectors interconnect the electrical devices of the vehicle with the wiring harness system, i.e., at terminations of the wiring harness segments. Thus, the electrical devices are referred to as termination devices. A junction block is a device for cross-connecting wiring harness segments, electrical system devices, individual wiring harness conductor wires, and other junction blocks. The conductors and connectors of the wiring harness system can be either electrical, optical, or both.

Improperly connected or nonconnected connectors result in the partial or complete failure of an electrical device or devices connected to the electrical system. Failure of a critical electrical system component may cause the vehicle to quit (i.e., lose drivability) which often requires the vehicle to be towed in for service. Interconnect problems that may inadvertently be present include both complete failures to properly interconnect connectors and partial interconnect failures such as when connectors are not fully inserted to their snap-lock position. These interconnect problems may not become apparent until extended use of the electrical system causes damage to an improperly connected device or until vibrations cause a partially connected connector to separate.

In order to maximize vehicle reliability and to minimize warranty and repair costs, it is desirable to reduce interconnect faults by detecting and isolating their occurrence. A simple and inexpensive system is needed which is adaptable to testing after final assembly, testing during service, and monitoring and fault prediction during vehicle use. Prior art wiring harness testing apparatus are complex and are not readily adaptable to testing under all circumstances.

U.S. Pat. No. 4,689,551, issued to Ryan et al, discloses a wiring harness testing apparatus which tests for proper assembly of the wiring harness itself, i.e., before the prefabricated harness is installed into a vehicle and before the termination connectors of the harness are connected to the vehicle electrical components. The termination connectors of the harness must be plugged into the testing apparatus or to a special adaptor for testing. Each wire in the harness being tested is connected at one end to a current source and at the other end to ground by switches in the testing apparatus that are connected to each wire. Since the testing apparatus must be connected to the termination connectors of the wiring harness, the tests are not possible after the wiring harness is connected into the vehicle electrical system.

European patent application 164570, in the name of Goto et al, discloses a wiring harness checker wherein a checker connects to each termination connector of the wiring harness being tested. The checker is connected to the harness on a test table and checks the conduction of individual conductors in the harness in both or either direction. Thus, the checker is useful only for testing before final assembly since there is no ability to check the harness after it is connected to the electrical components in the vehicle.

U.S. Pat. No. 4,271,388, issued to Schaling, discloses another testing apparatus requiring direct connection of the tester to the conductors and connectors of the cable set being tested. Shift registers are connected to one end of each conductor or connector to be tested. Light emitting diodes and logic circuits connected to the other end of each conductor or connector monitors signals received from the shift registers and indicate the correct or incorrect assembly of the wiring harness itself. Thus, the tester is suitable for testing only before final assembly with the electrical system components of the vehicle.

U.S. Pat. No. 3,718,859, issued to Arlow, discloses a test element in the form of a connector insert which allows monitoring of individual conductors while a wiring harness is interconnected and in operation. The test element plugs into and interconnects the pins of a pair of connectors. The test element includes terminals on its outer surface, each terminal being electrically connected to one of the connector pins and thus to one of the individual conductors of the wiring harness. The terminals may be contacted by a meter to monitor a signal on the corresponding individual conductor. Therefore, the individual conductor can only be tested when the corresponding electrical device is energized. Furthermore, the failure to monitor an expected signal from a conductor does not reveal the location or reason for the occurrence of the fault.

These are some of the deficiencies which the present invention overcomes.

Copending application Ser. No. (89-353) teaches a modified automobile electrical system including a dedicated test line in at least a portion of the electrical system. The dedicated test line includes additional conductors in the wiring harness and dedicated and modified connector components. By examining terminal characteristics of the dedicated test line after final assembly of the electrical system, faults in the interconnection of harness expansion connectors and termination connectors are detected and their location isolated. Thus, the dedicated test line includes one or more test points for examining the electrical characteristics of the test line. The dedicated test line includes a termination conductor within a termination connector, such that the termination conductor is included in the dedicated test line only when the device connected by the termination connector is properly interconnected with the electrical system.

Thus, the invention of the copending application achieves fault detection and isolation by connecting test equipment to two or more test points in the dedicated test line. In order to simplify the testing operation, it would be desirable to detect and isolate faults while requiring only one connection to the dedicated test line.

SUMMARY OF THE INVENTION

It is an object of the present invention to provide a method and apparatus for detecting an interconnection fault of an automotive electrical system including a wiring harness after final assembly of the harness with the electrical system devices.

It is another object of the invention to provide uncomplicated and reliable means for testing the interconnection of a wiring harness system including connections between the termination connectors of the wiring harness and the electrical components of the vehicle electrical system, while requiring only one point of interconnection between the test equipment and the wiring harness system being tested.

It is a further object of the invention to provide a method and apparatus for isolating the location of detected faults.

It is still another object of the invention to provide an automotive electrical system which can conveniently be tested after final assembly, during later servicing of the vehicle, and even during vehicle use.

These and other objects are achieved according to the present invention by sensing characteristics of the dedicated test line wherein the respective portion of the dedicated test line in each connector is coupled to a predetermined voltage potential through a respective impedance. Thus, the connected or disconnected state of each connector determines a unique total impedance that will be measured at a test point at the beginning of the dedicated test line. By measuring the impedance at the test point, not only the existence but also the location of one or more connector faults are determined.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF PREFERRED EMBODIMENTS

Figure 1:
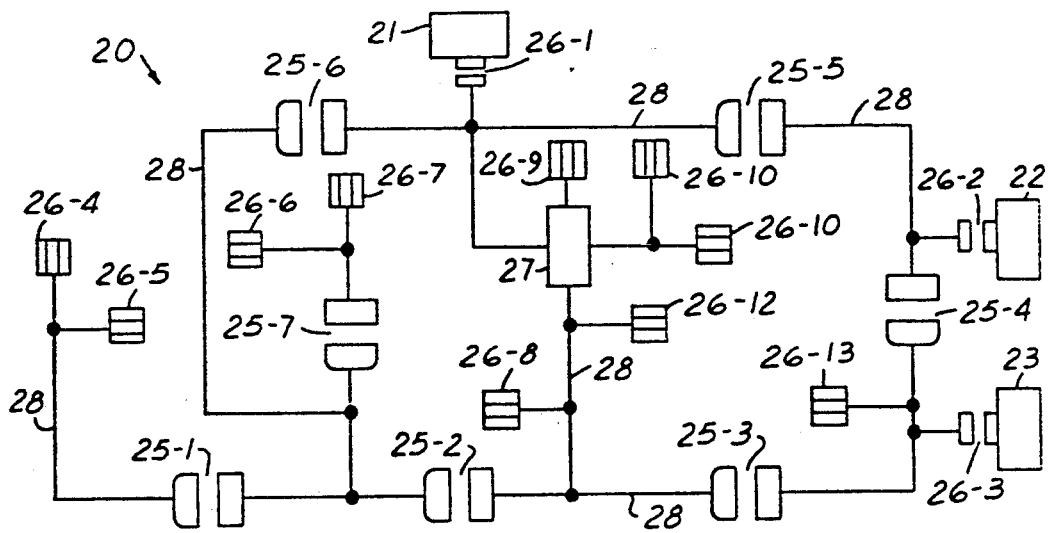
FIG. 1 is a diagram representing a portion of an automotive electrical system including a wiring harness system and termination devices.

FIG. 1 represents an automotive electrical system 20 including electrical system loads or supplies 21, 22, and 23, generally illustrative of various electrical components such as a radio, vehicle lighting, electric motors, or a voltage regulator. Since devices 21-23 are connected to the vehicle wiring harness through respective termination connectors 26-1, 26-2, and 26-3, each device is referred to as a termination device.

A wiring harness interconnects devices 21-23 and other devices (not shown for clarity of the drawing). The wiring harness includes a plurality of harness segments each comprised of a wire bundle, some of which are indicated at 28. Segments 28 are interconnected using expansion connectors 25. Termination connectors 26 interconnect the wiring harness with the termination devices of the electrical system. For example, a termination connector 26-1 interconnects termination device 21 with the wiring harness.

The wiring harness further includes a junction block 27 which connects through expansion connectors to harness segments 28 and which connects directly to some termination devices as shown. Segments 28 are shown as single lines although each contain a plurality of individual wires, some of which may leave the wire bundle at the several junction points.

Figure 2:
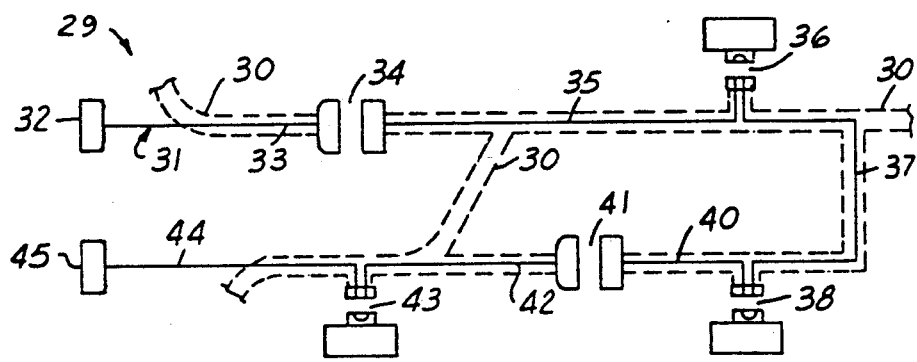
FIG. 2 is a diagram representing a portion of an automotive electrical system having a dedicated test line incorporated therein.

FIG. 2 represents a portion of an automotive electrical system 29 including a wiring harness 30 and a dedicated test line 31 according to the present invention. Dedicated test line 31 includes a first test point 32 connected to a first harness conductor 33 which enters wiring harness 30 and interconnects with an expansion connector 34. Dedicated test line 31 has corresponding connection pins mating in expansion connector 34 and continues with harness conductor 35. A termination connector 36 receives conductor 35 and provides a feed-through of the dedicated test line 31 to a harness conductor 37 when the termination device at termination connector 36 is properly interconnected. Harness conductor 37 feeds through another termination connector 38 only when its termination device is correctly interconnected. Dedicated test line 31 continues in a similar manner through a harness conductor 40, an expansion connector 41, a harness conductor 42, and a termination connector 43. After feeding through termination connector 43, dedicated test line 31 includes a harness conductor 44 extending to a second test point 45. Thus, there is a continuous electrical path from test point 32 to test point 45 only when each connector having dedicated test line 31 passing therethrough is properly interconnected.

As described in copending application Ser. No. (89-353), the proper interconnection of the electrical system can be tested by monitoring an electrical characteristic, such as continuity, of dedicated test line 31. Preferably, the portion of wiring harness 30 which includes dedicated test line 31 corresponds to the portions of the electrical system which are considered critical to operation of the vehicle and failure of which would cause the vehicle to quit or operate in an unacceptable manner.

Figure 3:
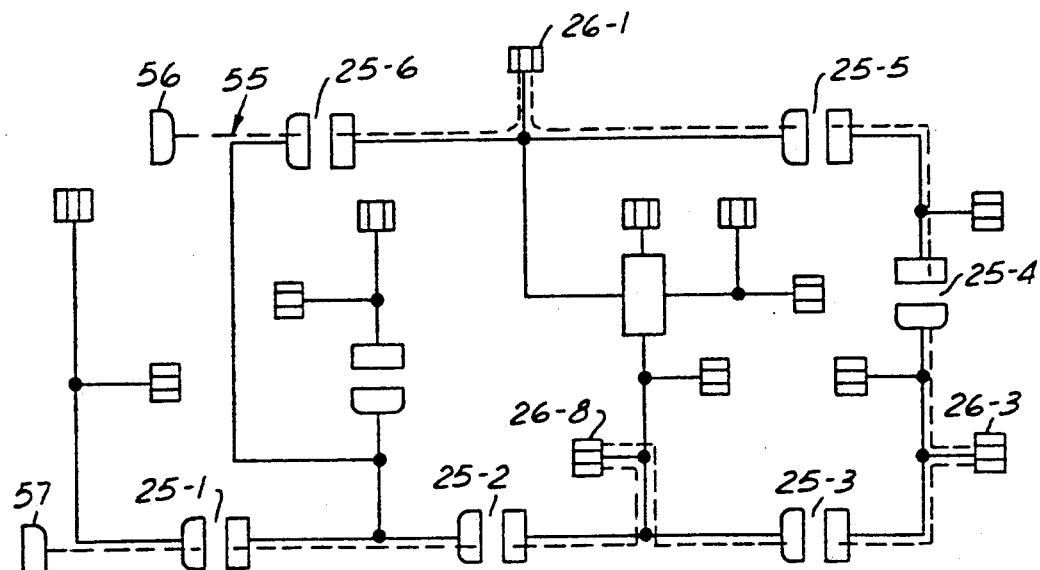
FIG. 3 is a diagram showing the addition of a dedicated test line to the electrical system shown in FIG. 1.

FIG. 3 illustrates the inclusion of a dedicated test line 55 into the electrical system of FIG. 1. Thus, dedicated test line 55 may extend from a first test point 56 and through critical electrical system components, including expansion connector 25-6, termination connector 26-1, expansion connector 25-5, expansion connector 25-4, termination connector 26-3, expansion connector 25-3, termination connector 26-8, expansion connector 25-2, and expansion connector 25-1, to a second test point 57.

Figure 4:
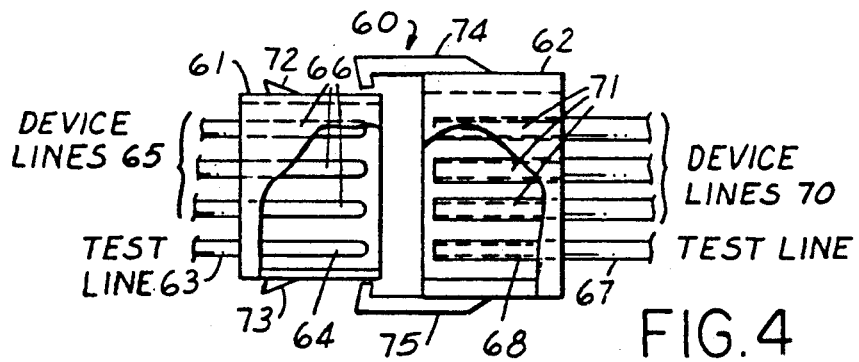
FIG. 4 is a cross-sectional view of an expansion connector containing a dedicated test line according to the present invention.

FIG. 4 shows one embodiment of a pin and socket expansion connector useful in the present invention. An expansion connector 60 includes a first end 61 and a second end 62. First end 61 receives a test line harness conductor 63 which is connected to a terminal pin 64. Standard device lines 65 of the wiring harness are connected to terminal pins 66. Second end 62 is connected to a test line harness conductor 67 which is joined to a terminal socket 68. Device lines 70 are connected to terminal sockets 71. Insertion of expansion connector ends 61 and 62 results in interconnection of the corresponding pins and sockets. On full insertion, expansion connector ends 61 and 62 are interlocked by means of projections 72 and 73 on first end 61 being received by locking tabs 74 and 75 on second end 62.

Figure 5:
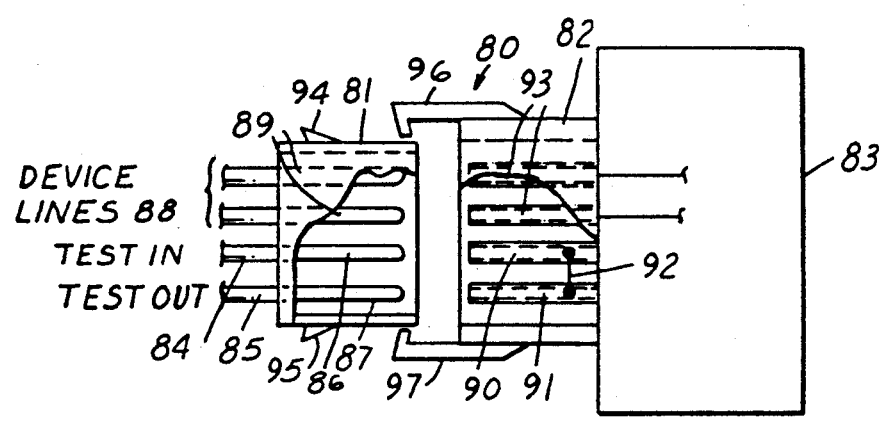
FIG. 5 is a cross-sectional view of a termination connector containing a dedicated test line according to the present invention.

FIG. 5 shows a termination connector according to one embodiment of the present invention. A pin and socket termination connector 80 includes a first end 81 at the harness end of the connector and a second end 82 which is at the device end of the connector and which is integral with a termination device 83. A harness conductor 84 provides a dedicated test line into termination connector 80 and is connected to a terminal pin 86. A harness conductor 85 provides a dedicated test line out of termination connector 80 and is connected to a terminal pin 87. Device lines 88 from the wiring harness are connected to terminal pins 89.

A terminal socket 90 and a terminal socket 91 in second connector end 82 are joined by a termination conductor 92 for feeding through the dedicated test line between harness conductors 84 and 85 when termination connector 80 is properly interconnected. Upon full insertion of the harness end and the device end of termination connector 80, the connector is locked by means of projections 94 and 95 on first connector end 81 and locking tabs 96 and 97 on second connector end 82.

Figure 6:
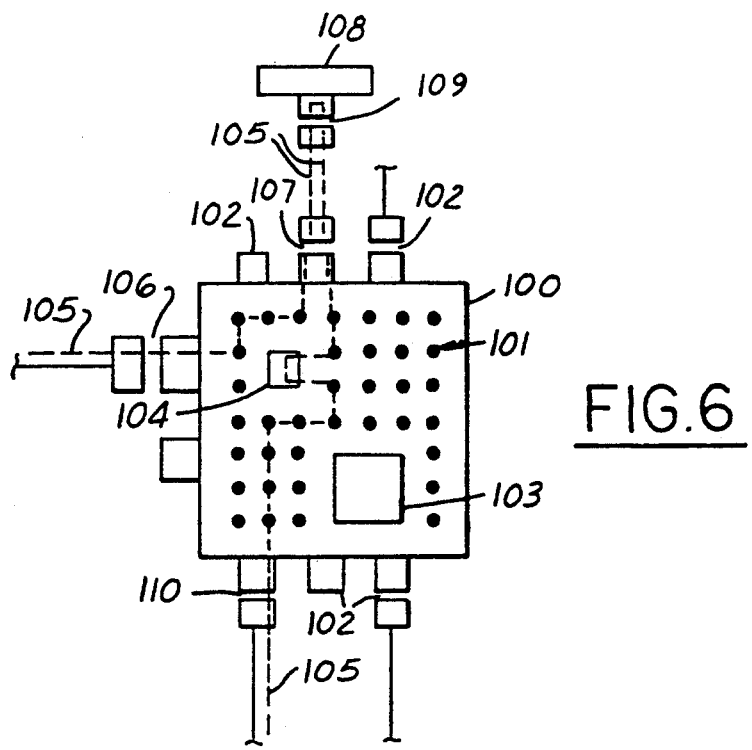
FIG. 6 is a plan view of a junction block containing a dedicated test line according to the present invention.

FIG. 6 shows a junction block 100 which may be included in the electrical system of the present invention. Junction block 100 is comprised of an integral molded block including conductors and interconnection points 101. Junction block 100 also includes a plurality of expansion connectors 102. Likewise, termination devices 103 and 104 are connected directly to junction block 100.

Junction block 100 further includes a dedicated test line 105 passing therethrough. Dedicated test line 105 is included in expansion connector 106 and passes into junction block 100. By means of a conductor integral with junction block 100, dedicated test line 105 passes into an expansion connector 107 and through termination connector 109 including a termination device 108. Dedicated test line 105 reenters junction block 100 through expansion connector 107 and passes through termination device 104 before exiting junction block 100 through an expansion connector 110.

Figure 7:
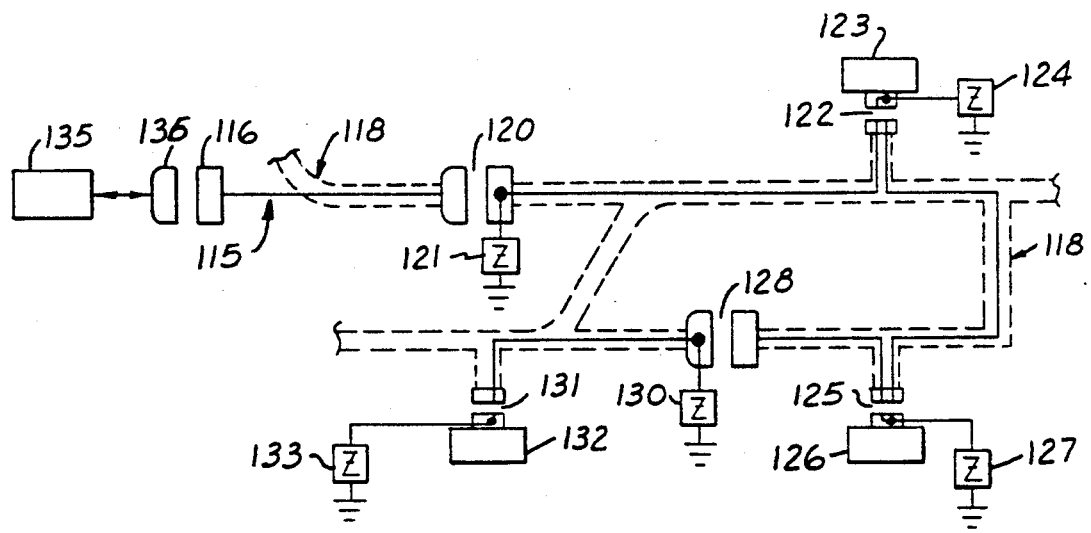
FIG. 7 is a diagram showing a test apparatus of the present invention connected to a dedicated test line including characterizing impedances.

A network analysis fault detection and isolation system of the present invention is shown in FIG. 7. A dedicated test line 115 begins at a test point 116. From test point 116, dedicated test line 115 enters a wiring harness 118 and passes through an expansion connector 120, a termination connector 122, a termination connector 125, an expansion connector 128, and to a termination connector 131.

In order to provide a test line electrical characteristic which is indicative of the interconnection states of the connectors, dedicated test line 115 is connected at selected points to a predetermined electrical potential by a plurality of impedances. One end of connector 120 includes a path to ground through an impedance 121. The device end of termination connector 122 includes a path to ground through an impedance 124. The device end of termination connector 125 includes a path to ground through an impedance 127. Likewise, an expansion connector 128 includes a path to ground through an impedance 130 and a termination connector 131 includes a path to ground through an impedance 133. Each respective impedance is connected to the end of each respective connector which is remote from test point 116. Thus, impedance 121 is Part of the total impedance that can be measured from test point 116 only if expansion connector 120 is properly interconnected. Furthermore, impedance 124 is included in the total impedance measured at test point 116 only when termination connector 122 and expansion connector 120 are properly interconnected. In that case, the total impedance seen at test point 116 includes the parallel combination of impedances 121 and 124. Likewise, impedances 127, 130, and 133 contribute to the total impedance in parallel when connectors 125, 128, and 131 are properly interconnected.

Testing apparatus for the present invention includes a network analyzer 135 connected to test point 116 through a test probe 136. In particular, analyzer 135 measures the total impedance at test point 116. Impedances 121, 124, 127, 130, and 133 have preselected values such that the total impedance measured by network analyzer 135 corresponds uniquely to the actual interconnection state of the set of connectors. Thus, if all connectors are properly interconnected, then the total measured impedance equals the parallel combination of all the preselected impedances. The total impedance is determined by the preselected impedance values, subject to an error range corresponding to the tolerances of the preselected impedances. If any of the connectors are disconnected, then the succeeding impedances are not included in the total impedance measured at test point 116. The total impedance then has a different value which uniquely identifies the disconnected connector in the dedicated test line. After correcting the identified fault, the total impedance can be again checked by analyzer 135 to verify the correct interconnection of the complete system or identify the next failed connector.

Figure 8:
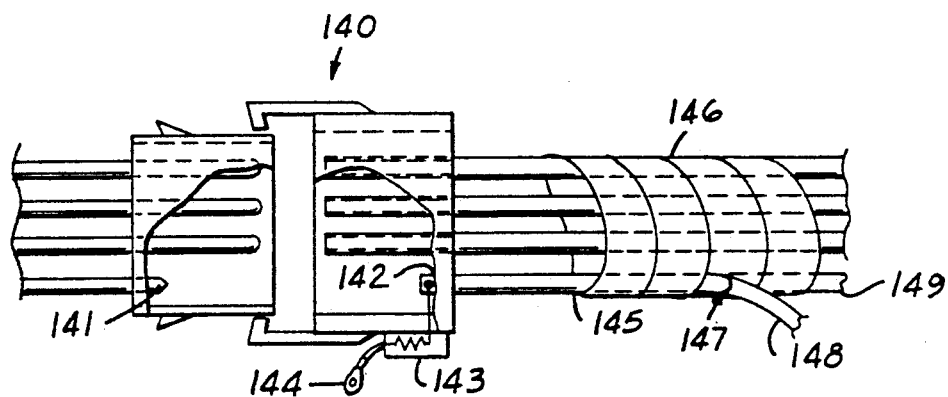
FIG. 8 is a cross-sectional and schematic view of a modified expansion connector according to the present invention.

FIG. 8 shows an expansion connector particularly adapted to the network analysis method of the present invention. An expansion connector 140 has a first terminal pin 141 and a second terminal socket 142 for the dedicated test line. A resistor 143 has one end connected to terminal socket 142 and has its other end connected to a lead wire lug 144. Terminal socket 142 is also connected to a wiring harness conductor 145 as part of the dedicated test line. Conductor 145 is included in a wiring harness bundle 146 and is connected to a splice 147 which splits the dedicated test line into a pair of conductors 148 and 149.

In use, lead wire lug 144 is connected to a predetermined potential, e.g., to ground potential, such that impedance 143 will be included in the total impedance measurable from the test point (not shown) only when expansion connector 140 is fully interconnected, i.e., when terminal pin 141 contacts terminal socket 142. Terminal pin 141 and terminal socket 142 are shown in a last-make first-break configuration whereby they will be the last to make contact during connector insertion and will be the first to disconnect during separation due to their reduced length relative to the other terminal pins and sockets.

Splice 147 and the splitting of the dedicated test line into two conductors 148 and 149 is employed in an alternative embodiment of the invention which will be described in connection with FIG. 10.

Figure 9:
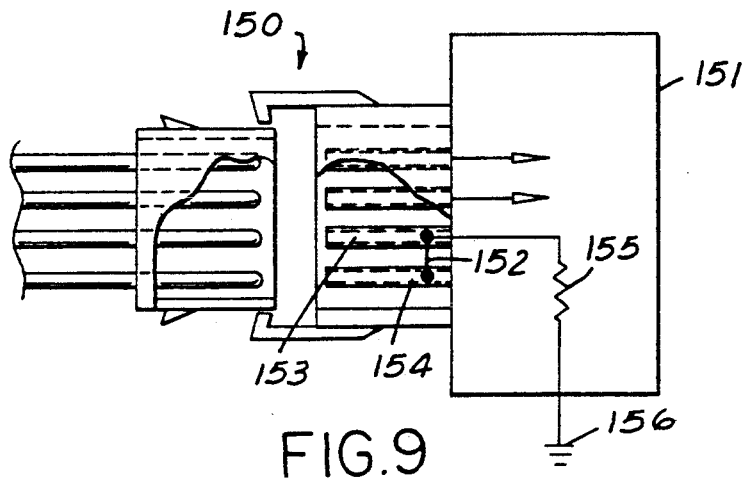
FIG. 9 is a cross-sectional and schematic view of a modified termination connector according to the present invention.

FIG. 9 shows a termination connector 150 for interconnecting a termination device 151 into a vehicle electrical system. Termination connector 150 includes a termination conductor 152 feeding between a terminal socket 153 and a terminal socket 154 in the device end of connector 150. A resistor 155 has one end connected to termination conductor 152 and its other side connected to ground 156.

Figure 10:
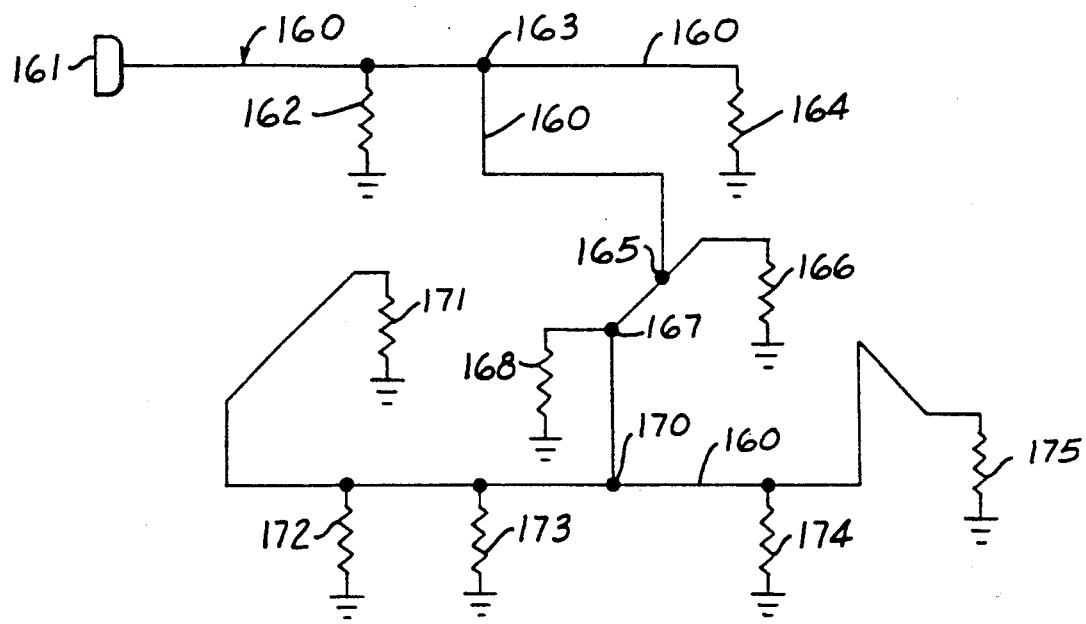
FIG. 10 is a schematic diagram of a dedicated test line and characterizing impedances of the invention.

Turning now to FIG. 10, a dedicated test line and characterizing impedances are shown wherein the dedicated test line does not form a simple linear line or loop. Rather, the dedicated test line is split at various locations to prevent the improper connection of a single connector from blocking out a large amount of information concerning the remaining connectors. Thus, a dedicated test line 160 originates at a test point 161. An impedance or resistance 162 is associated with a first connector (not shown). Connectors are not shown in FIG. 10 but are present at the interconnection points of each of the resistors in the Figure. Dedicated test line 160 includes a splice 163 splitting dedicated test line 160. The divided test line then extends in parallel to a resistor 164 and to another splice 165. Splice 165 is connected to a resistor 166 and to another splice 167. From splice 167, dedicated test line 160 continues to a resistor 168 and to another splice 170. Dedicated test line 160 extends in one direction from splice 170 to resistors 171, 172, and 173, and in the other direction to resistors 174 and 175.

In operation, if the connector associated with resistor 162 is not properly connected, a substantially infinite impedance is presented to test point 161 and information concerning any of the remaining connectors is not available. If the connector associated with resistor 162 is properly connected, but the connector having resistor 164 is not properly connected, then resistor 162 is included in the total impedance measured from test point 161 while resistor 164 is not. However, the disconnection of the connector associated with resistor 164 does not block out information concerning any other connectors because dedicated test line 160 was split at splice 163. By carefully selecting the resistance values for all the resistors, each possible combination of connected and disconnected connectors corresponds to a unique total resistance as measured at test point 161.

Figure 11:
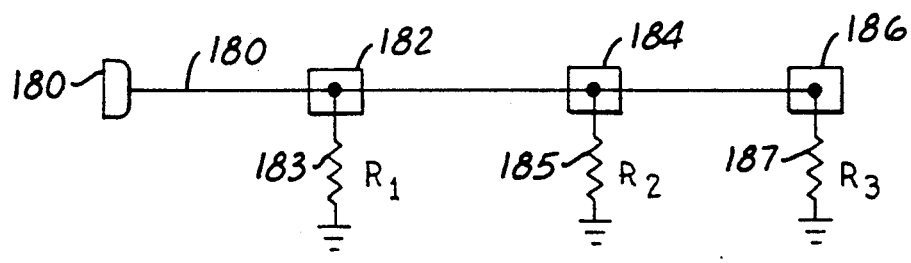
FIG. 11 is a schematic diagram of a first test line interconnection technique of the invention.

FIG. 11 shows a simplified case in which a dedicated test line 180 extends in series without any branching. Dedicated test line 180 begins at a test point 181 and includes connectors 182, 184, and 186. Resistors 183, 185, and 187 provide paths to ground from connectors 182, 184, and 186, respectively. The embodiment of FIG. 11 has the benefit that selection of resistance values $R_1$, $R_2$, and $R_3$ for resistors 183, 184, and 185, respectively, is straightforward. If the first connector 182 is not properly interconnected, then the total resistance measured at test point 181 is substantially infinite. If connector 182 is the only properly connected connector, then the total resistance equals $R_1$. Since each succeeding resistor is added in parallel to $R_1$, the total resistance value decreases according to the values of those resistors. For example, $R_1$, $R_2$, and $R_3$ may all be equal to 100 ohms. Thus, if connector 182 is properly connected, but connector 184 is not, then the total resistance equals the resistance of $R_1$, or approximately 100 ohms. If the fault involving connector 184 is then properly corrected, but if connector 186 exhibits a connection fault, then the total resistance measured equals the parallel combination of resistors $R_1$ and $R_2$, or about 50 ohms. If all connectors are properly interconnected, then the total resistance equals the parallel combination of $R_1$, $R_2$, and $R_3$, or approximately 33 ohms. Even using resistors having a 10% error tolerance, the highest resistance of three resistors in parallel is approximately 37 ohms, while the lowest possible resistance of two resistors in parallel is approximately 45 ohms. Thus, the case of one disconnected connector is easily distinguishable from the case of no disconnected connectors.

Figure 12:
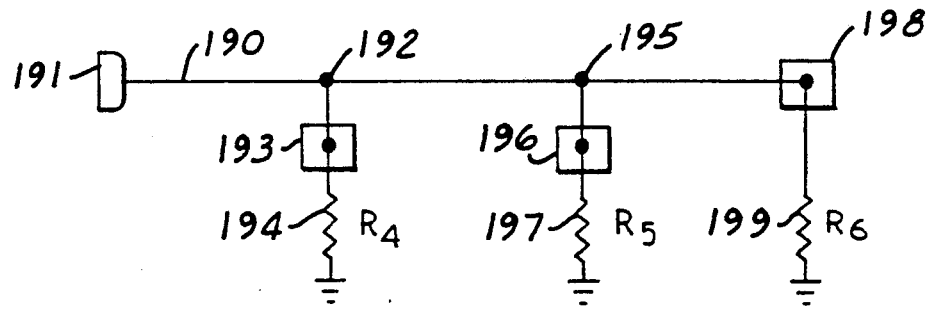
FIG. 12 is a schematic diagram of a second test line interconnection technique of the invention.

FIG. 12 shows an alternative embodiment wherein a dedicated test line 190 includes splices such that the contribution of a resistor associated with any particular connector to the total resistance is not dependent on the interconnection of any other connector. Thus, test line 190 begins at a test point 191 and includes a splice 192 which is connected to a connector 193 and to a splice 195. Splice 195 is connected to a connector 196 and to a connector 198. Resistors 194, 197, and 199 provide paths to ground from connectors 193, 196, and 198, respectively. Resistor 194 has a resistance $R_4$, resistor 197 has a resistance $R_5$, and resistor 199 has a resistance $R_6$. Since the contribution of each individual resistor to the total resistance is not corrolated with the state of any other connector, each resistance must have a unique value in order to uniquely identify each disconnected connector. For example, $R_4$ could be 100 ohms, $R_5$ could be 200 ohms, and $R_6$ could be 300 ohms. In this example, if all connectors are properly interconnected, then the total resistance measured at test point 191 is approximately 54 ohms. If connector 198 is not properly connected (thus removing $R_6$), the total resistance rises to approximately 66 ohms. If only connector 196 is not properly connected (thus removing $R_5$), the total resistance resulting from $R_4$ and $R_6$ is approximately 75 ohms. If only connector 193 is not properly connected, then the total resistance provided by $R_5$ and $R_6$ is approximately equal to 120 ohms.

If any single connector is the only properly connected connector, then the total resistance equals the corresponding resistance $R_4$, $R_5$, or $R_6$. Furthermore, if none of the connectors are properly interconnected, then the total resistance is substantially infinite. Thus, a unique resistance value measured at test point 191 exists for each possible combination of connects or disconnects for each connector in the dedicated test line. In addition, the embodiments of FIGS. 11 and 12 can be employed together as in FIG. 10.

Although resistances have been shown in the preferred embodiment for the characterizing line impedances, it will be apparent to those skilled in the art that capacitors, inductors, semiconductors, or other devices can be employed to provide the characteristic While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An automotive electrical system comprising:
   a plurality of electrical components including at least one termination device;
   a wiring harness system interconnecting said electrical components and including a plurality of harness conductors and a plurality of connectors, at least one of said connectors being a termination connector connected to a termination device, said wiring harness system including a dedicated test line provided by a termination conductor disposed in said termination connector and provided by more than one of said harness conductors, said dedicated test line including a test point, selected ones of said connectors including an impedance, each impedance coupling said dedicated test line in each respective connector to a predetermined electrical potential;
   electrical source means connected to said test point for applying a test signal to said dedicated test line at said test point; and
   measuring means connected to said test point for sensing a response of said dedicated test line during application of said test signal, whereby an electrical characteristic of said response identifies a connector fault in said wiring harness system.

2. The electrical system of claim 1 wherein said termination connector has a harness end and a device end, one of said impedances being connected between said predetermined potential and said termination conductor disposed in said device end of said termination connector.

3. The electrical system of claim 1 wherein said predetermined electrical potential is vehicle ground.

4. An electrical system comprising:
   a plurality of wiring harness conductors;
   a plurality of terminal connectors;
   a plurality of electrical components each connected to a respective terminal connector;
   a dedicated test line originating at a test point and including a portion of said wiring harness conductors and at least a portion of said terminal conductors such that said dedicated test line establishes an electrical path through said electrical system which is complete only when each terminal connector in said portion of terminal connectors is correctly interconnected; and
   a plurality of impedances each having a first end connected to a predetermined common electrical potential and having a second end connected to said dedicated test line in a respective terminal connector, whereby a total impedance measured at said test point identifies the location of an interconnect fault.

5. The system of claim 4 wherein said dedicated test line connects said impedances in parallel.

6. The system of claim 4 wherein each of said impedances is comprised of a resistor.

7. The system of claim 4 wherein said predetermined common electrical potential is comprised of vehicle ground.

8. A method for testing the interconnection of an automotive electrical system comprising the steps of:
   providing a plurality of electrical termination devices;
   interconnecting said termination devices using a wiring harness system including a plurality of harness conductors and a plurality of connectors, said connectors including a plurality of termination connectors each connected to a respective termination device;
   providing a dedicated test line in said wiring harness system including a plurality of termination conductors each disposed in a respective termination connector, said dedicated test line further including more than one of said harness conductors;
   providing a plurality of impedances each having a first end connected to a predetermined common electrical potential and having a second end connected to a respective termination conductor;
   providing a test point in said dedicated test line;
   applying a test signal at said test point; and
   measuring an electrical characteristic at said test point resulting from said test signal as an indication of proper interconnection of at least a portion of said electrical system.

9. The method of claim 8 wherein said dedicated test line follows a path including terminal connectors for a plurality of critical electrical components in said electrical system.

* * * * *